(12) United States Patent
Hsu et al.

(10) Patent No.: US 7,042,066 B2
(45) Date of Patent: May 9, 2006

(54) DUAL-TRENCH ISOLATED CROSSPOINT MEMORY ARRAY

(75) Inventors: Sheng Teng Hsu, Camas, WA (US);
Wei Pan, Vancouver, WA (US);
Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/039,536

(22) Filed: Jan. 19, 2005

(65) Prior Publication Data

US 2005/0136602 A1    Jun. 23, 2005

Related U.S. Application Data

(62) Division of application No. 10/350,643, filed on Jan. 23, 2003, now Pat. No. 6,875,651.

(51) Int. Cl.
*H01L 29/00* (2006.01)

(52) U.S. Cl. ............ 257/536; 257/379; 438/262; 438/257; 438/264; 438/129; 438/599; 438/424; 438/238; 438/536

(58) Field of Classification Search .......... 257/536, 257/379, E21.662; 438/262, 257, 264, 129, 438/599, 424, 238

See application file for complete search history.

(56) References Cited

U.S. PATENT DOCUMENTS 5,238,855 A * 8/1993 Gill .................... 438/261

* cited by examiner

*Primary Examiner*—George Fourson
*Assistant Examiner*—Julio J. Maldonado
(74) *Attorney, Agent, or Firm*—David C. Ripma

(57) ABSTRACT

A memory array dual-trench isolation structure and a method for forming the same have been provided. The method comprises: forming a p-doped silicon (p-Si) substrate; forming an n-doped (n+) Si layer overlying the p-Si substrate; prior to forming the n+ Si bit lines, forming a p+ Si layer overlying the n+ Si layer; forming a layer of silicon nitride overlying the p+ layer; forming a top oxide layer overlying the silicon nitride layer; performing a first selective etch of the top oxide layer, the silicon nitride layer, the p+ Si layer, and a portion of the n+ Si layer, to form n+ Si bit lines and bit line trenches between the bit lines; forming an array of metal bottom electrodes overlying a plurality of n-doped silicon (n+ Si) bit lines, with intervening p-doped (p+) Si areas; forming a plurality of word line oxide isolation structures orthogonal to and overlying the n+ Si bit lines, adjacent to the bottom electrodes, and separating the p+ Si areas; forming a plurality of top electrode word lines, orthogonal to the n+ Si bit lines, with an interposing memory resistor material overlying the bottom electrodes; and, forming oxide-filled word line trenches adjacent the word lines.

12 Claims, 11 Drawing Sheets

B-B' CROSS SECTION

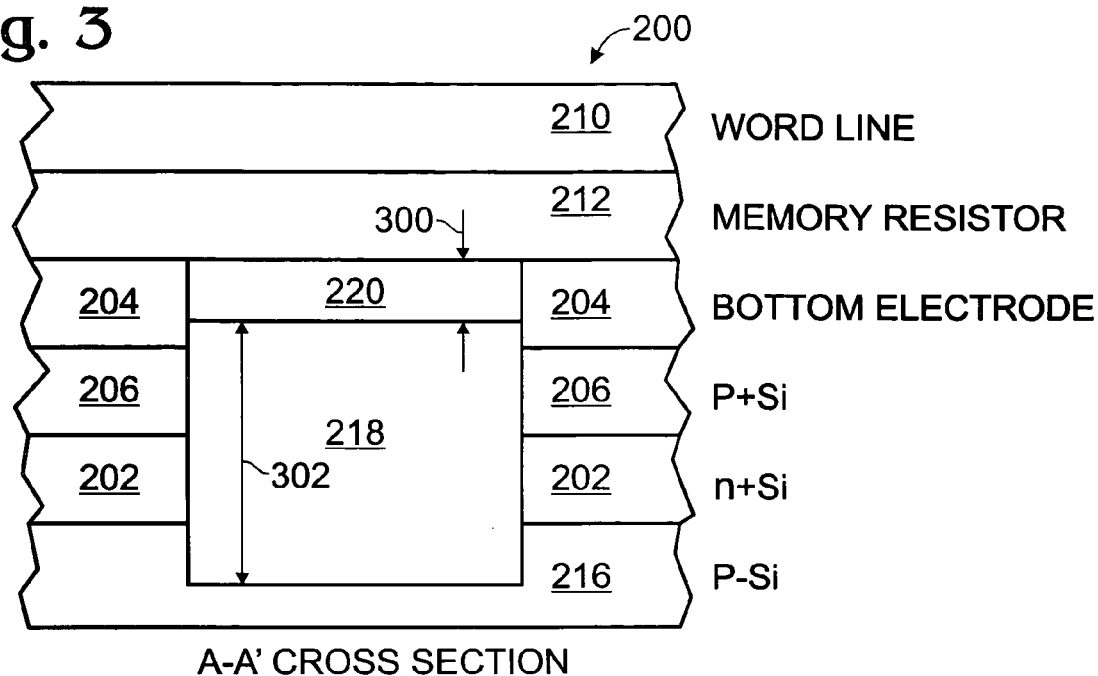
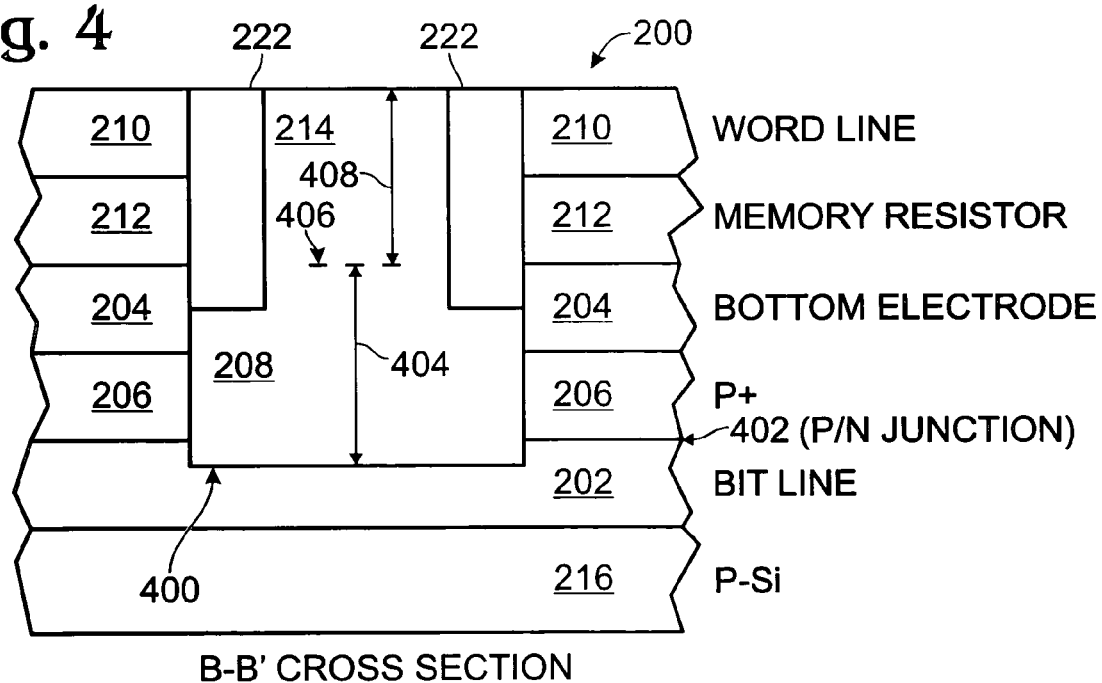

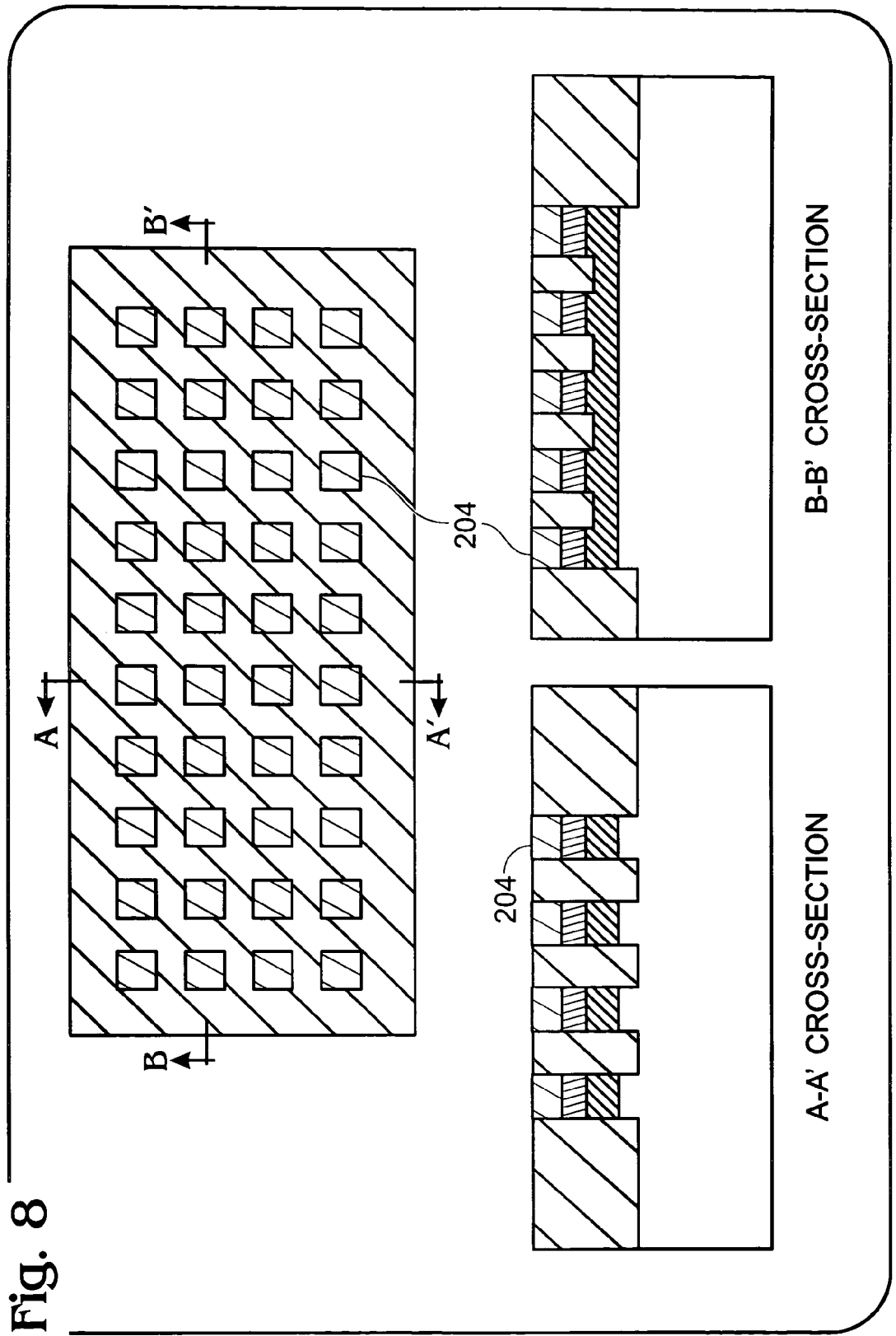

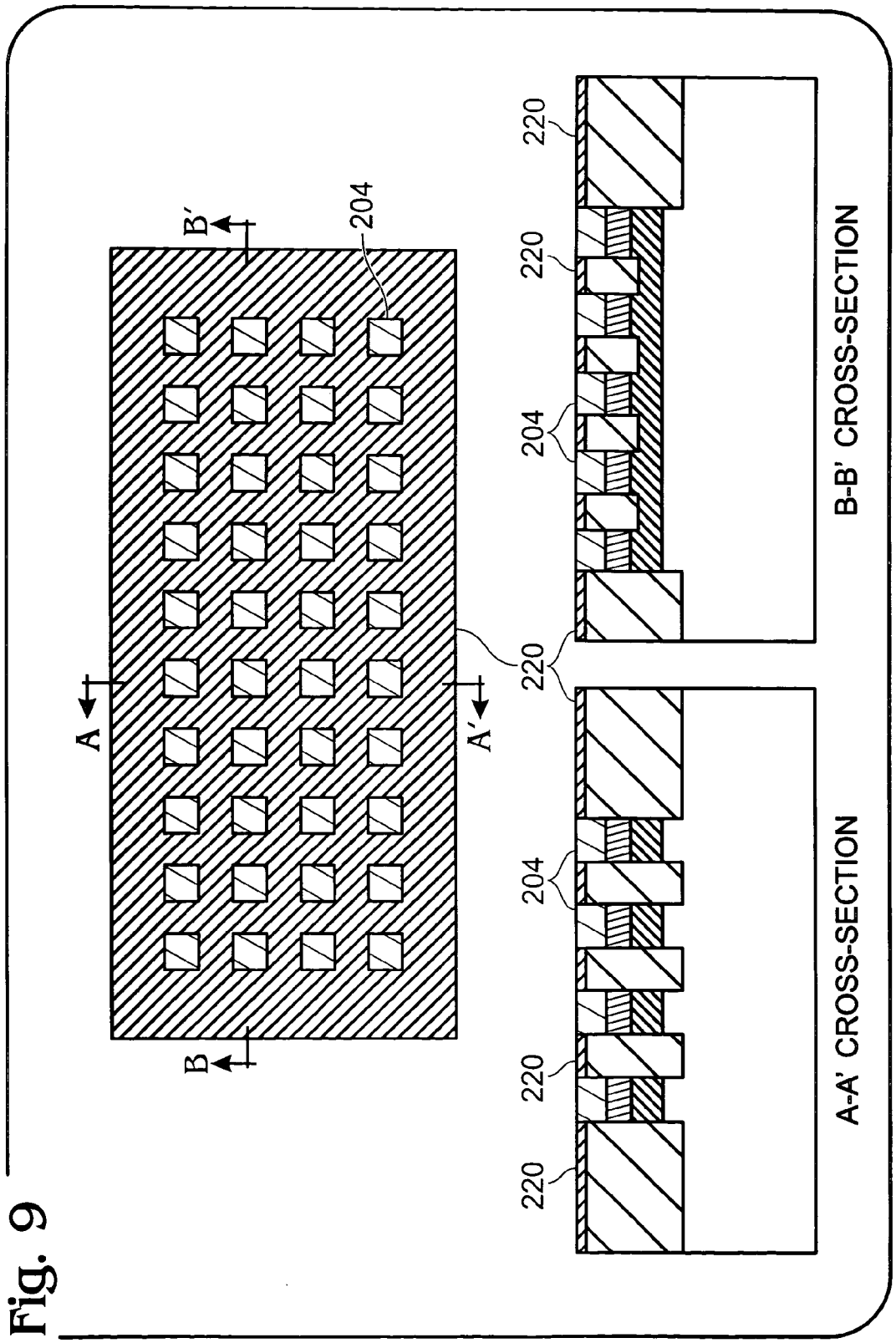

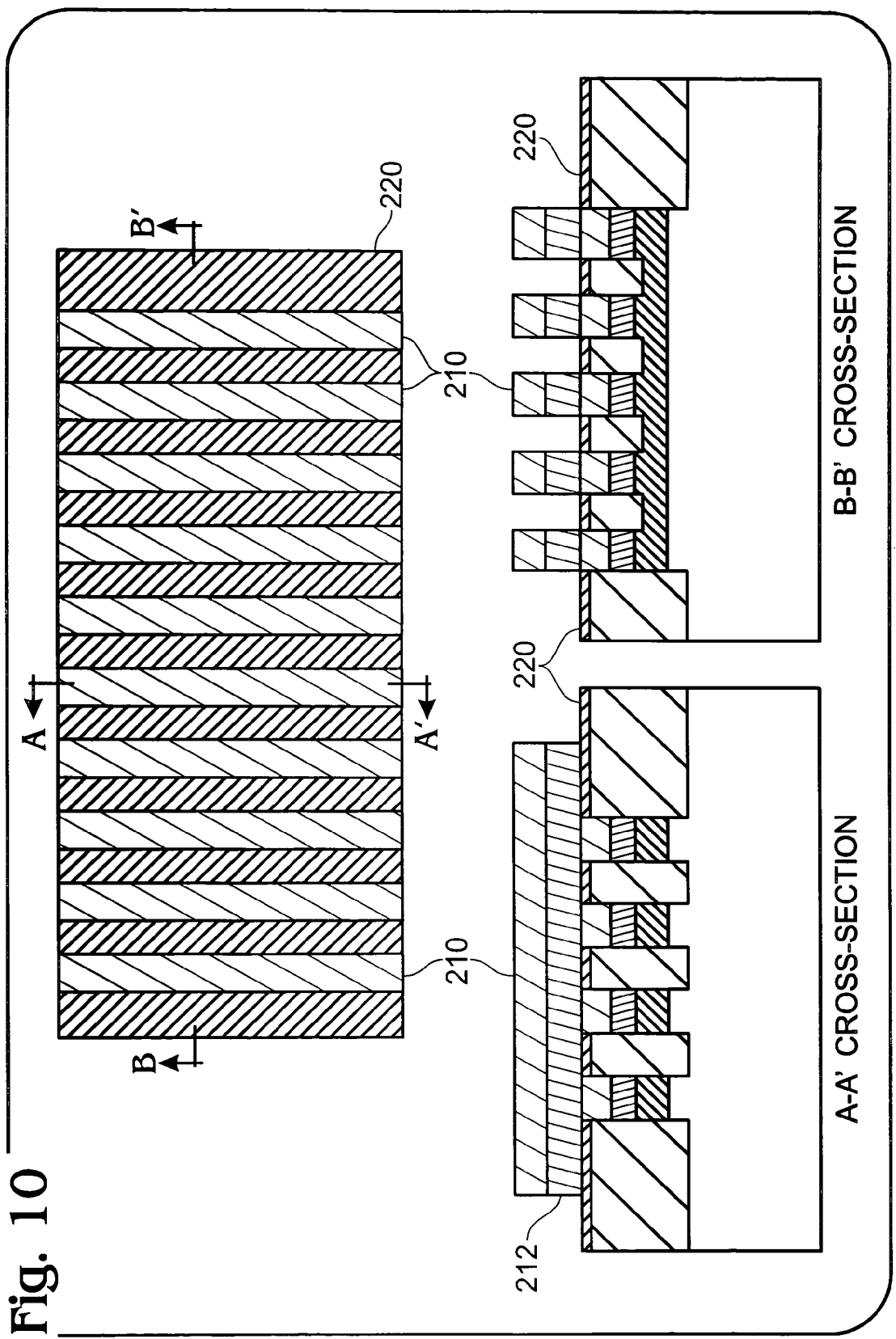

DUAL-TRENCH ISOLATED CROSSPOINT MEMORY ARRAY

RELATED APPLICATIONS

This application is a Divisional of a patent application entitled, DUAL-TRENCH ISOLATED CROSSPOINT MEMORY ARRAY AND METHOD FOR FABRICATING SAME, invented by Hsu et al., Ser. No. 10/350,643, filed Jan. 23, 2003 now U.S. Pat. No. 6,875,651.

BACKGROUND OF THE INVENTION

1. Field of the Invention

This invention generally relates to integrated circuit (IC) fabrication and, more particularly, to a memory array with improved isolation regions formed between the pin junctions underlying an array of one resistor/one diode (1R1D) bottom electrodes.

2. Description of the Related Art

Typically, an 1R1D resistor random access memory (RRAM) uses n-doped silicon (n+ Si) bit lines. An array of bottom electrodes are formed over the bit lines with intervening p-doped (p+) Si areas. The interface between the p+ Si and the n+ Si bit lines forms a p/n junction. Conventional fabrication processes permit the formation of adequate oxide isolation regions between the bit lines, as the trench and oxide isolation structures can be formed relatively early in the process, extending into the underlying silicon (Si) substrate. However, it is more difficult to isolate adjacent p/n junctions along a common (the same) bit line. The lack of proper isolation may result in crosstalk between electrodes during reading and programming operations.

FIG. 1 is a partial cross-sectional view of a trench isolated resistor memory array in two orthogonal axes (prior art). Each n+ bit line is isolated from the other bit lines by oxide trenches, as is showed in the left-hand side of FIG. 1. The right-hand side of the figure shows the cross-section along an n+ bit line. Where there are p+ areas, a p/n junction is formed overlying the n+ bit line. Although the p+ areas and the bottom electrodes are self-aligned, the p+ areas are formed by an ion implanted shallow junction. As a result, the breakdown voltage may be low and the crosstalk between adjacent bottom electrodes may be high.

It would be advantageous if adjacent p/n junctions of a 1R1D bottom electrode could be more adequately isolated along a common bit line.

SUMMARY OF THE INVENTION

This present invention describes a dual oxide trench isolation structure that provides for improved oxide isolation regions between 1R1D bottom electrode p/n junctions. Generally, the greater isolation is achieved by isolating the n+ bit lines with relatively deep trenches, while shallower trenches are used to isolate the p/n bit line junctions. As an option, the memory resistors may be encapsulated in botton electrode metal, a barrier isolation material (such as $TiO_2$), and top electrode metal to prevent reactions between silicon oxide and the memory resistor, which is typically either a colassal magetoresistance (CMR) or high temperature superconductivity material.

Accordingly, a method is provided for forming a dual-trench isolation structure in a memory array. The method comprises: forming a p-doped silicon (p-Si) substrate; forming an n-doped (n+) Si layer overlying the p-Si substrate; prior to forming the n+ Si bit lines, forming a p+ Si layer overlying the n+ Si layer; forming a layer of silicon nitride overlying the p+ layer; forming a top oxide layer overlying the silicon nitride layer; performing a first selective etch of the top oxide layer, the silicon nitride layer, the p+ Si layer, and a portion of the n+ Si layer, to form n+ Si bit lines and bit line trenches between the bit lines; forming an array of metal bottom electrodes overlying a plurality of n-doped silicon (n+ Si) bit lines, with intervening p-doped (p+) Si areas; forming a plurality of word line oxide isolation structures orthogonal to and overlying the n+ Si bit lines, adjacent to the bottom electrodes, and separating the p+ Si areas; forming a plurality of top electrode word lines orthogonal to the n+ Si bit lines, with an interposing memory resistor material overlying the bottom electrodes; and, forming an oxide-filled word line trench adjacent the word lines.

In some aspects of the method, forming a plurality of word line oxide isolation structures overlying the n+ Si bit lines includes forming a portion of the word line oxide isolation structures extending into the underlying n+ Si bit lines.

In other aspects, forming an array of metal bottom electrodes overlying a plurality of n+ Si bit lines, with intervening p+ Si areas includes: performing a second etch, deepening the bit line trenches and etching the top oxide layer, the silicon nitride layer, the p+ Si layer, the n+ Si layer, and a portion of the p-Si substrate to form word line trenches orthogonal to the bit line trenches; filling the bit line and word line trenches with trench oxide; chemical-mechanically polishing (CMPing) the trench oxide and top oxide to the silicon nitride layer; etching to remove the silicon nitride and exposing an array of p+ Si areas; isotropically depositing bottom electrode metal; and, CMPing the bottom electrode metal to the trench oxide.

Additional details of the above-described method and a memory array with dual trench isolation structures are provided below.

BRIEF DESCRIPTION OF THE DRAWINGS

FIG. 3 is a detailed view of an oxide-filled bit line trench in the A–A' cross-section.

FIG. 4 is a detailed view of the word line isolation structure in the B–B' cross-section.

FIG. 8 is a plan view, and partial cross-section views in orthogonal axes, following the formation of the bottom electrode.

FIG. 9 is a plan view, and partial cross-section views in orthogonal axes, following the formation of the first barrier insulator.

FIG. 10 is a plan view, and partial cross-section views in orthogonal axes, following the formation of the top electrode.

DETAILED DESCRIPTION OF THE PREFERRED EMBODIMENTS

Figure 1:
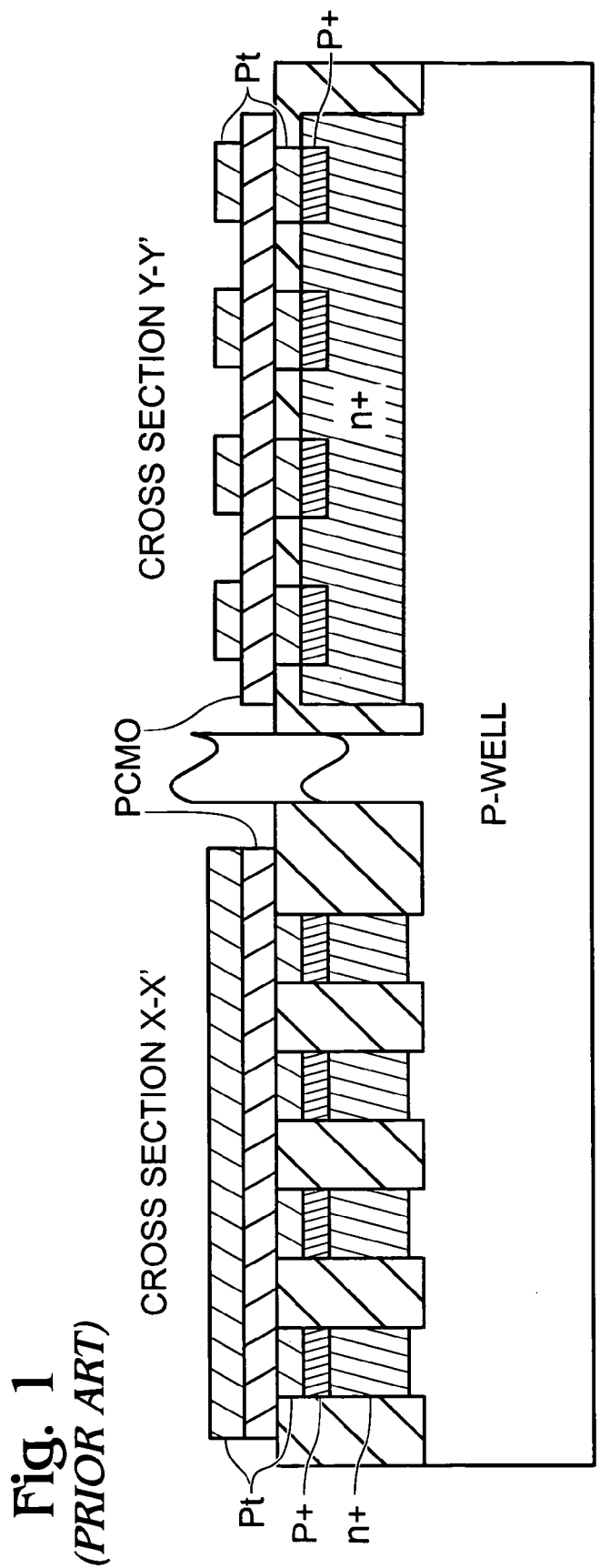
FIG. 1 is a partial cross-sectional view of a trench isolated resistor memory array in two orthogonal axes (prior art).
Figure 2:
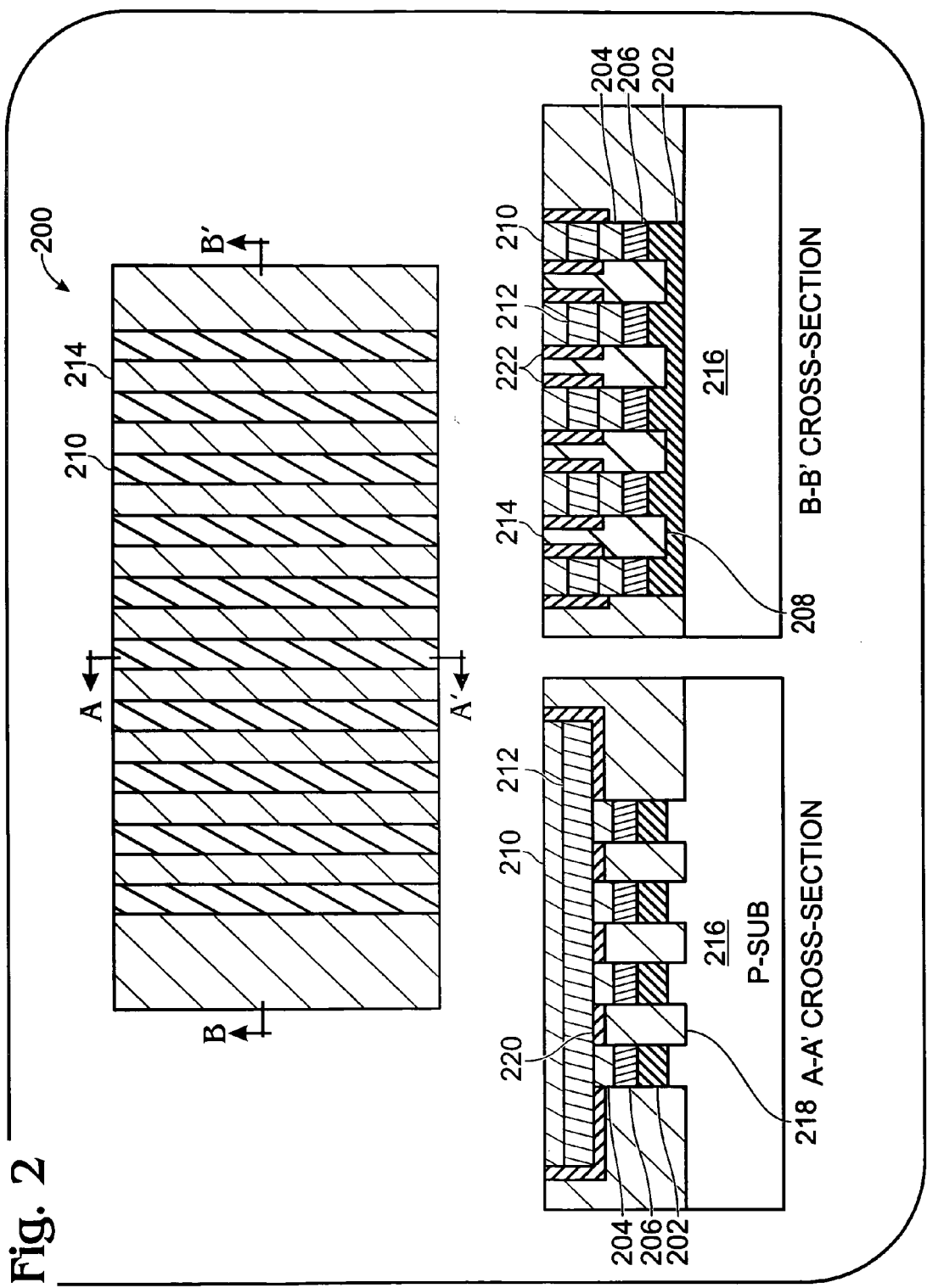
FIG. 2 is a plan view, and partial cross-sectional views along orthogonal axes, of the present invention memory array with dual-trench isolation structures.

FIG. 2 is a plan view, and partial cross-sectional views along orthogonal axes, of the present invention memory array with dual-trench isolation structures. The memory array shown is a 1R1D memory array, however, the principles of the isolation structures described below could be applied to other types of memory arrays. The memory array 200 includes a plurality of n-doped silicon (n+ Si) bit lines 202. Four bit lines 202 are shown in the A–A' cross-section, but the array is not limited to any particular number of bit lines. An array of metal bottom electrodes 204 overlie the n+ Si bit lines 202, with intervening p-doped (p+) Si areas 206.

A plurality of word line oxide isolation structures 208 are orthogonal to, and overlying the n+ Si bit lines 202. The word line oxide isolation structures 208 are adjacent the bottom electrodes 204 and separating the p+ Si areas 206. A plurality of top electrode word lines 210 is orthogonal to the bit lines 202, with an interposing memory resistor material 212 overlying the bottom electrodes 204. Although ten word lines 210 are shown in the plan view, the array is not limited to any particular number of word lines. Oxide-filled word line trenches 214 overlie the word line oxide isolation structures 208, adjacent the word lines 210.

The memory array 200 further comprises a p-doped silicon (p-Si) substrate 216. The plurality of n+ Si lines 202 overlies the p-Si substrate 216. In some aspects of the array 200 (as shown), the word line oxide isolation structures 208 extend into the underlying n+ Si bit lines. Oxide-filled bit line trenches 218 are formed between the bit lines 202, underlying the word lines 210. Typically, the memory resistor 212 is a material such as $Pr_{0.3}Ca_{0.7}MnO_3$ (PCMO), colossal magnetoresistance (CMR), or high temperature superconductivity (HTSC) materials. However, the array is not limited to any particular type of memory resistor material.

In some aspects, the memory array 200 further comprises a first barrier insulator layer 220 overlying the oxide-filled bit line trenches 218 and adjacent to bottom electrodes 204. In other aspects, the memory array 200 further comprises a second barrier insulator sidewalls 222 interposed between the word lines 210 and the oxide-filled word line trenches 214.

FIG. 3 is a detailed view of an oxide-filled bit line trench 218 in the A–A' cross-section. As shown, the first barrier insulation layer 220 has a thickness 300 in the range of 10 to 30 nanometers (nm). The oxide-filled bit line trenches 218 have a thickness 302 extending below the interface of the n+ Si bit lines and the underlying p-Si substrate. In some aspects, the thickness 302 is in the range of 400 to 700 nm.

FIG. 4 is a detailed view of the word line isolation structure 208 in the B–B' cross-section. The first and second barrier insulators are materials such as $TiO_2$, $Al_2O_3$, or $Si_3N_4$. However, other materials could also be used. As shown, the word line oxide isolation structures 208 have a bottom 400 extending below the interface 402 (p/n junction) of the p+ Si areas and the underlying n+ Si bit lines. The word line oxide isolation structures 208 have a thickness 404, defined from the interface of the bottom electrode 204 and memory resistor 212 to word line oxide isolation structure bottom 400, in the range of 200 to 500 nm. The top surface 406 of the word line isolation structure 208 is formed in the same CMP process that defines the top surface of the bottom electrode. Therefore, oxide-filled word line trenches 214 interfaces with the word line oxide isolation structure 208 at the word line isolation structure top surface 406, along the interface between the bottom electrode 204 and memory resistor 212. The oxide-filled word line trench 214 has a thickness 408 in the range of 300 to 400 nm. Alternately, the word line isolation structure 208 and the oxide-filled word line trench 214 may be considered a single element, formed in separate processes, with an overall thickness in the range of 500 to 900 nm.

Functional Description

The present invention dual-trench isolation system provides a very high density crosspoint resistor memory array, with oxide isolation of each memory bit. The array exhibits a small cell size and low bit-to-bit crosstalk, yet the fabrication process is compatible to that of a conventional Ultra High Density Integration circuit.

The process begins with p-silicon substrate. Conventional n-wells and p-wells are used for pMOST and nMOST fabrication, respectively. The memory array is fabricated on the p-silicon substrate to minimize the n+ bit line parasitic capacitance. The fabrication process is as follows:

The relatively deeper n+ junction is formed with an implantation process, using an energy of 100 KeV to 200 KeV and a dosage of $5 \times 10^{14}$ to $2 \times 10^{15}/cm^2$ (phosphorous), or 200 KeV to 400 KeV and a dosage of $5 \times 10^{14}$ to $2 \times 10^{15}/cm^2$ (arsenic). This implantation is followed by a shallow p+ ion implantation, such as 5 to 20 KeV with a dosage of $1 \times 10^{15}$ to $4 \times 10^{15}/cm^2$ of boron, or 20 to 80 KeV at a dosage of $1 \times 10^{15}$ to $4 \times 10^{15}/cm^2$ of $BF_2$, to form p/n junction on the p-substrate. A thin layer of silicon nitride 500 is deposited, with thickness in the order of 100 nm to 300 nm, followed by a top oxide coat with a thickness of 50 nm to 500 nm (not shown).

Figure 5:
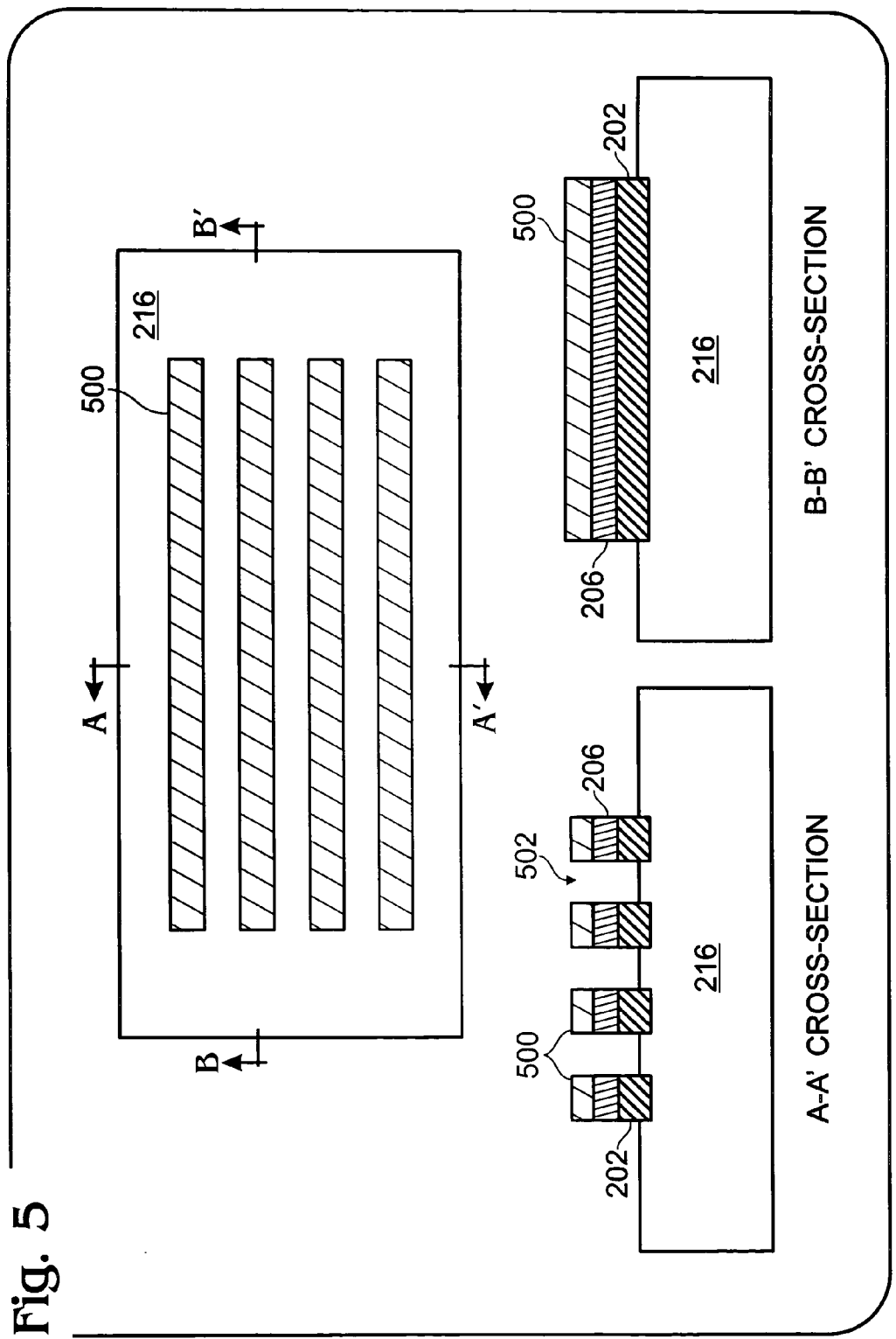
FIG. 5 is a plan view, and partial cross-section views in orthogonal axes, following the silicon nitride deposition.

FIG. 5 is a plan view, and partial cross-section views in orthogonal axes, following the silicon nitride deposition. Photoresist is used to etch the silicon nitride 500 and underlying silicon, forming the bit line trench 502. The bit line trench depth 502 is about 300 nm to 500 nm.

Figure 6:
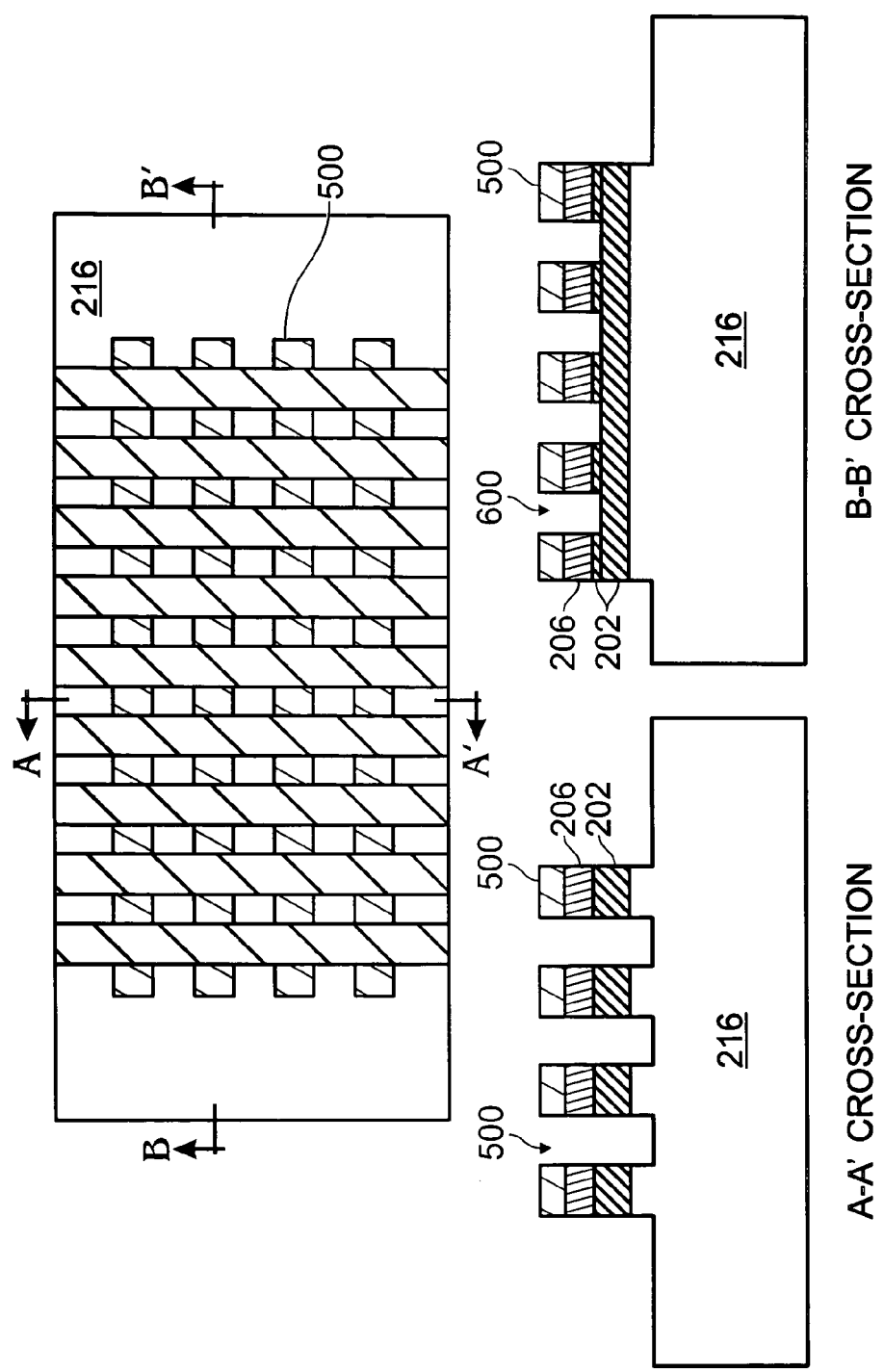
FIG. 6 is a plan view, and partial cross-section views in orthogonal axes, following a second etching.

FIG. 6 is a plan view, and partial cross-section views in orthogonal axes, following a second etching. After the first trench etch, photoresistance is stripped and a second photoresist is applied to form a second trench 600 for the oxide isolation structure (see 208, FIG. 2). The second trench 600 has a depth of about 200 nm to 500 nm. During the second trench etching the first (bit line) trench is further etched, into the substrate 216. The second trench is deeper than the n+/p-substrate junction. Following the etch, the resist is stripped.

Figure 7:
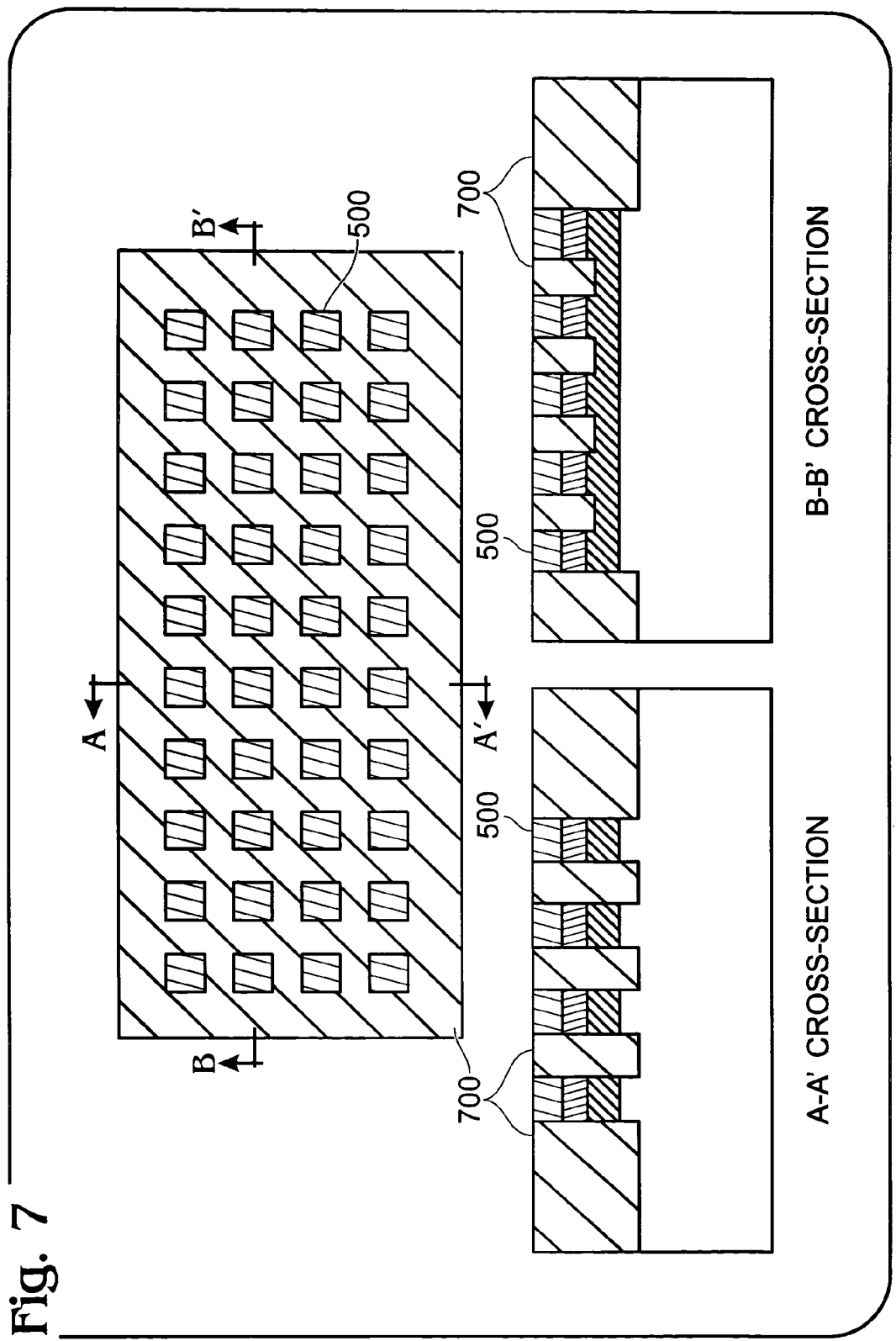
FIG. 7 is a plan view, and partial cross-section views in orthogonal axes, following an oxide fill and CMP.

FIG. 7 is a plan view, and partial cross-section views in orthogonal axes, following an oxide fill and CMP. The CMP process stops at the nitride layer 500. Any conventional processes can be used to refill and CMP the silicon trenches.

FIG. 8 is a plan view, and partial cross-section views in orthogonal axes, following the formation of the bottom electrode. The silicon nitride is selectively removed using a hot $H_3PO_4$ wet etch, or other conventional process. The bottom electrode is deposited and CMP'ed to the trench oxide.

FIG. 9 is a plan view, and partial cross-section views in orthogonal axes, following the formation of the first barrier insulator. The wafer is etched in BHF solution or in plasma to remove 10 nm to 30 nm of oxide. A thin layer of the first barrier insulator 220, such as $TiO_2$ or $Si_3N_4$ is deposited, and CMP'ed to expose the bottom electrode 204.

FIG. 10 is a plan view, and partial cross-section views in orthogonal axes, following the formation of the top electrode. The memory resistor material 212, such as CMR or a high temperature superconductivity material, is deposited followed by the deposition of top electrode 210. Photoresist is used as mask to etch the top electrode 210. The top electrode 210 can also be formed by single damascene CMP process. During top electrode etching, the exposed portion of memory resistor material may also be etched.

Returning to FIG. 2, a second barrier insulator 222, such as $TiO_2$ or $Si_3N_4$, is deposited followed by passivation oxide deposition and final metallization. The second barrier insulator 222 may be anisotropically etched to remove all barrier oxide on the flat surface, forming barrier oxide passivation at the sidewall of the memory resistors, as shown. If a memory resistor material is used that does not react to silicon oxide and hydrogen, there is no need for the first and second barrier insulators 220/222.

Figure 11A:
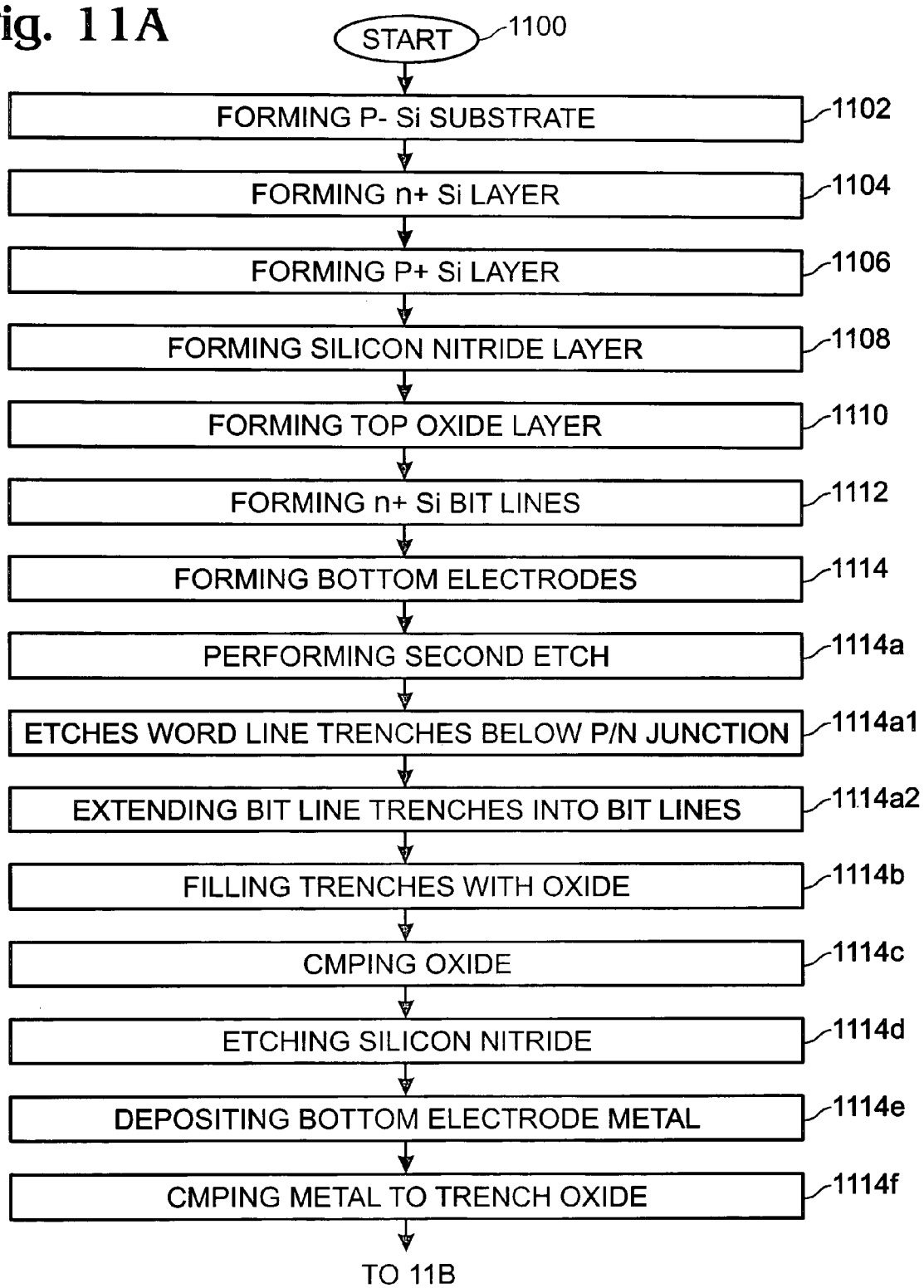
FIGS. 11A through 11B are flowcharts illustrating the present invention method for forming a dual trench isolation structure in a memory array.
Figure 11B:
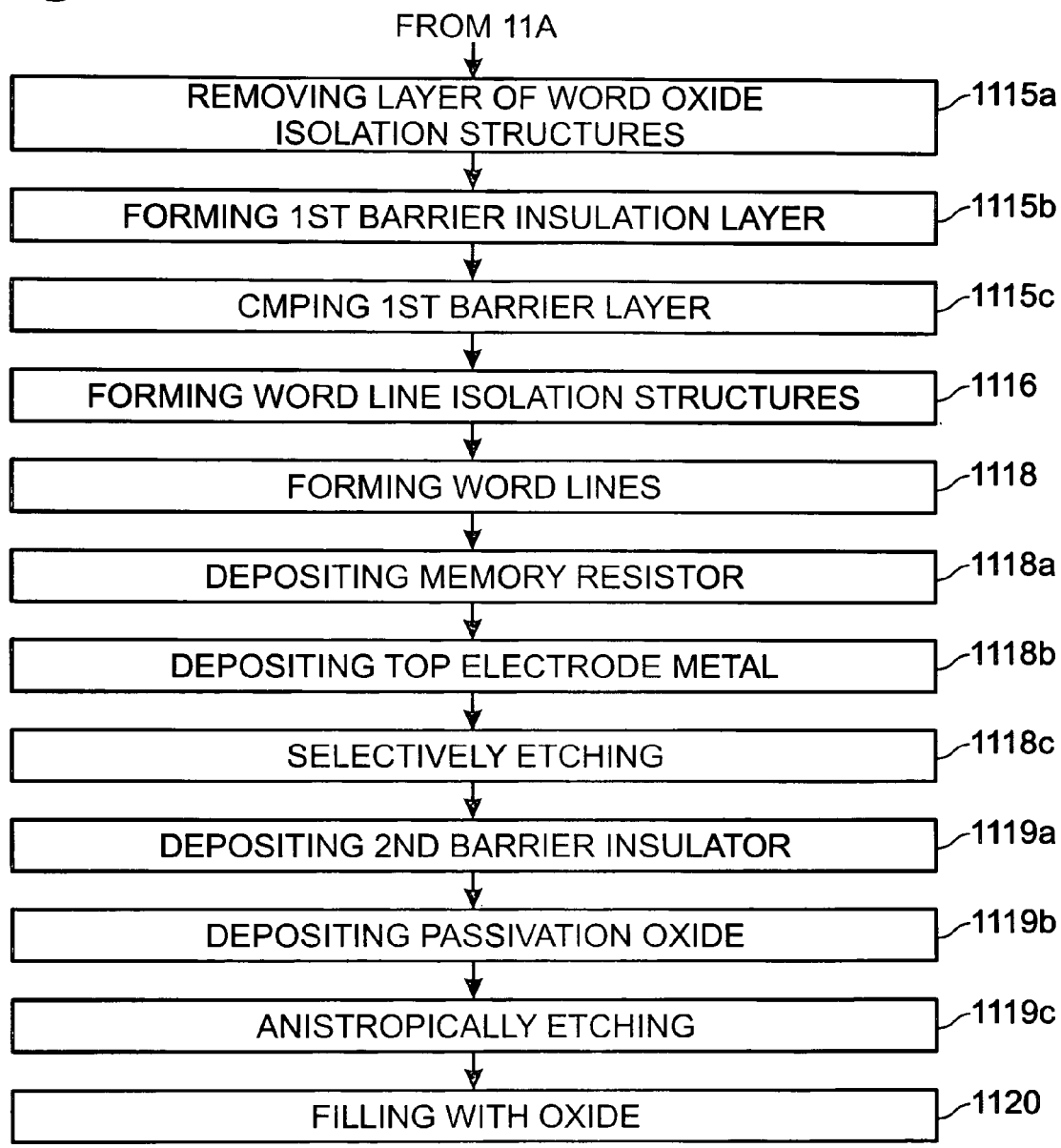

FIGS. 11A through 11B are flowcharts illustrating the present invention method for forming a dual trench isolation structure in a memory array. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1100.

Step 1102 forms a p-doped silicon (p-Si) substrate. Step 1104 forms an n-doped (n+) Si layer overlying the p-Si substrate. Step 1106, prior to forming the n+ Si bit lines, forms a p+ Si layer overlying the n+ Si layer. Step 1108 forms a layer of silicon nitride overlying the p+ layer. Step 1110 forms a top oxide layer overlying the silicon nitride layer. Step 1112, from the n+ Si layer, forms the plurality of n+ Si bit lines. Step 1114 forms an array of metal bottom electrodes overlying a plurality of n-doped silicon (n+ Si) bit lines, with intervening p-doped (p+) Si areas. Step 1116 forms a plurality of word line oxide isolation structures orthogonal to and overlying the n+ Si bit lines. The word line isolation structures are adjacent to the bottom electrodes, separating the p+ Si areas. Step 1118 forms a plurality of top electrode word lines, orthogonal to the n+ Si bit lines, with an interposing memory resistor material overlying the bottom electrodes. Step 1120 forms oxide-filled word line trenches adjacent the word lines.

In some aspects of the method, forming a plurality of word line oxide isolation structures overlying the n+ Si bit lines in Step 1116 includes forming a portion of the word line oxide isolation structures extending into the underlying n+ Si bit lines. In other aspects, forming the n+ Si bit lines in Step 1112 includes performing a first selective etch of the top oxide layer, the silicon nitride layer, the p+ Si layer, and a portion of the n+ Si layer, to form bit line trenches between the bit lines.

In some aspects, forming an array of metal bottom electrodes overlying a plurality of n+ Si bit lines, with intervening p+ Si areas in Step 1114 includes substeps. Step 1114a performs a second etch, deepening the bit line trenches and etching the top oxide layer, the silicon nitride layer, the p+ Si layer, the n+ Si layer, and a portion of the p-Si substrate to form word line trenches orthogonal to the bit line trenches. Step 1114b fills the bit line and word line trenches with trench oxide. Step 1114c CMPs the trench oxide and top oxide to the silicon nitride layer. Step 1114d etches to remove the silicon nitride and exposing an array of p+ Si areas. For example, a hot H3PO4 wet etch can be used to remove the silicon nitride and expose the array of p+ Si areas. Step 1114e isotropically deposits bottom electrode metal. Step 1114f CMPs the bottom electrode metal to the trench oxide.

In some aspects, forming a plurality of top electrode word lines, orthogonal to the bit lines, with an interposing memory resistor material overlying the bottom electrodes in Step 1118 includes substeps. Step 1118a deposits a memory resistor material. Step 1118b deposits a top electrode metal. Step 1118c selectively etches the top electrode and memory resistor material to form a plurality of word lines overlying the bottom electrode, orthogonal to the bit lines.

In some aspects, depositing a memory resistor material in Step 1118a includes using a memory resistor material such as PCMO, colossal magnetoresistance (CMR), or high temperature superconductivity (HTSC) materials. Then, the method comprises further steps. Step 1115a, following the formation of the array of bottom electrodes (Step 1114), uses a process including a BHF solution or plasma to remove a layer of the word line oxide isolation structures to a depth in the range of 10 to 30 nanometers (nm). Step 1115b forms a first barrier insulator layer overlying the trench oxide. Step 1115c CMPs the first barrier insulator layer to the bottom electrode metal.

In other aspects, Step 1119a, following the formation of the word lines, deposits a second barrier insulator. Step 1119b deposits a passivation oxide layer overlying the second barrier insulator. Step 1119c anisotropically etches the passivation oxide layer and the second barrier insulator, forming second barrier insulator sidewalls adjacent the word lines. The first and second barrier insulators deposited in Steps 1115b and 1119a, respectively, can be TiO2, Al2O3, or Si3N4.

In some aspects, forming an n+ Si layer overlying the p-Si substrate in Step 1104 includes doping the n+ Si layer with a process selected from the group including phosphorous with an energy level in the range of 100 KeV to 200 KeV and dosage in the range of $5 \times 10^{14}$ to $2 \times 10^{15}/cm^2$, and arsenic with an energy level in the range of 200 KeV to 400 KeV and dosage in the range of $5 \times 10^{14}$ to $2 \times 10^{15}/cm^2$.

In some aspects, forming a p+ Si layer overlying the n+ Si layer in Step 1106 includes doping the p+ Si layer with a process selected from the group including boron with an energy level in the range of 5 KeV to 20 KeV and dosage in the range of $1 \times 10^{15}$ to $4 \times 10^{15}/cm^2$, and BF2 with an energy level in the range of 20 KeV to 80 KeV and dosage in the range of $1 \times 10^{15}$ to $4 \times 10^{15}/cm^2$.

In some aspects of the method, forming a silicon nitride layer overlying the p+ Si layer in Step 1108 includes forming the silicon nitride layer to a thickness in the range of 100 to 300 nm, and forming a top oxide layer overlying the silicon nitride in Step 1110 includes forming a top oxide layer having a thickness in the range of 50 to 500 nm.

In other aspects, performing a first selective etch of the top oxide layer, the silicon nitride layer, the p+ Si layer, and a portion of the n+ Si layer, to form bit line trenches between the n+ Si bit lines in Step 1112 includes forming bit line trenches with a depth in the range of 200 to 500 nm.

In some aspects, performing a second etch, deepening the bit line trenches and etching the top oxide layer, the silicon nitride layer, the p+ Si layer, the n+ layer, and a portion of the p-Si substrate to form word line trenches orthogonal to the bit line trenches in Step 1114a includes additional substeps. Step 1114a1 etches the word line trenches to a depth below the interface of the p+ Si overlying the n+ Si bit lines (the p/n junction). Step 1114a2 extends the bit line trenches to a depth below the interface of the n+ Si bit lines overlying the p-Si substrate.

Alternately stated (but not shown), performing a second etch in Step 1114a includes etching the word line trenches to a depth in the range of 200 to 500 nm, and extending the bit line trenches to a total depth within the range of 400 to 700 nm.

A memory array dual-trench isolation structure and method for forming the same have been provided. Although presented in the context of memory array using bit and word lines, it should be understood that the present invention has greater application and can be used in a broader class of array structures. Further, the invention has been shown to be compatible with conventional IC fabrication processes. It should be understood that the invention is not limited to the particular processes that were used to demonstrate the fabrication of the isolation structures. Other variations and embodiments of the invention will occur to those skilled in the art.

We claim:

1. A memory array with dual trench isolation structures comprising:
   a plurality of n-doped silicon (n+ Si) bit lines;
   an array of metal bottom electrodes overlying the n+ Si bit lines, with intervening p-doped (p+) Si areas;
   a plurality of word line oxide isolation structures orthogonal to and overlying the n+ Si bit lines, adjacent the bottom electrodes, and separating the p+ Si areas;
   a plurality of top electrode word lines, orthogonal to the bit lines, with an interposing memory resistor material overlying the bottom electrodes; and,
   oxide-filled word line trenches overlying the word line oxide isolation structures, adjacent the word lines.

2. The memory array of claim 1 further comprising:
   a p-doped silicon (p-Si) substrate; and,
   wherein the plurality of n+ Si lines overlie the p-Si substrate.

3. The memory array of claim 2 wherein the word line oxide isolation structures extend into the underlying n+ Si bit lines.

4. The memory array of claim 3 further comprising:
   oxide-filled bit line trenches between the bit lines, underlying the word lines.

5. The memory array of claim 4 wherein the memory resistor material is selected from a group including PCMO, colossal magnetoresistance (CMR), and high temperature superconductivity (HTSC) materials;
   the memory array further comprising:
   a first barrier insulator layer overlying the oxide-filled bit line trenches and adjacent to bottom electrodes, having a thickness in the range of 10 to 30 nanometers (nm).

6. The memory array of claim 5 further comprising:
   second barrier insulator sidewalls interposed between the word lines and the oxide-filled word line trenches.

7. The memory array of claim 6 wherein the first and second barrier insulators are materials selected from the group including TiO2, Al2O3, and Si3N4.

8. The memory array of claim 4 wherein the word line oxide isolation structures have a bottom extending below the interface of the p+ Si areas and the underlying n+ Si bit lines.

9. The memory array of claim 8 wherein the word line oxide isolation structures have a thickness in the range of 200 to 500 nm.

10. The memory array of claim 4 wherein the oxide-filled bit line trenches have a thickness extending below the interface of the n+ Si bit lines and the underlying p-Si substrate.

11. The memory array of claim 10 wherein the oxide-filled bit line trenches have a thickness in the range of 400 to 700 nm.

12. The memory array of claim 9 wherein the oxide-filled word line trenches have a thickness in the range of 300 to 400 nm.

* * * * *